(12) United States Patent
Webster et al.

(10) Patent No.: US 6,738,441 B1
(45) Date of Patent: May 18, 2004

(54) METHOD AND DEVICE FOR FILTERING INPUT SIGNALS

(75) Inventors: Steve R. Webster, Raymond, NH (US); Richard H. Breinlinger, Hampstead, NH (US); Kenneth L. Wester, Nashua, NH (US)

(73) Assignee: Schneider Automation Inc., North Andover, MA (US)

( * ) Notice: Subject to any disclaimer, the term of this patent is extended or adjusted under 35 U.S.C. 154(b) by 755 days.

(21) Appl. No.: 09/609,354

(22) Filed: Jul. 5, 2000

(51) Int. Cl.[7] .................................................. H04B 1/00
(52) U.S. Cl. ........................................ 375/350; 375/257
(58) Field of Search .................................. 375/219, 257, 375/350, 377

(56) References Cited

U.S. PATENT DOCUMENTS 4,446,498 A * 5/1984 Stich ........................... 361/87
6,118,284 A * 9/2000 Ghoshal et al. .............. 324/750
6,226,575 B1 * 5/2001 Lu et al. ......................... 701/29

* cited by examiner

Primary Examiner—Young T. Tse
(74) Attorney, Agent, or Firm—Larry I. Golden

(57) ABSTRACT

A method and device for filtering an input signal received by an input module in order to produce a filtered input signal, wherein the received input signal is converted such that it has either a HIGH input state or a LOW input state each having a time duration characteristic of the input module, and the filtered input signal is represented by an ON filtered state and an OFF filtered state. The time duration of the HIGH input state and the LOW input state are determined by sampling the converted input signal at a certain sampling rate so as to allow the sampling results to be used by a filtering algorithm to set the filtered input state to ON or OFF based on a set of filter parameters which may vary from one input module to another. The filtering device is adapted to be configurable such that the filter parameters can be electronically selected so that the same filtering algorithm can be used for different input modules having different electrical characteristics.

10 Claims, 5 Drawing Sheets

METHOD AND DEVICE FOR FILTERING INPUT SIGNALS

FIELD OF THE INVENTION

The present invention relates generally to an input module and, more particularly, an algorithm for filtering noise and transient from the input signals of an input module.

BACKGROUND OF THE INVENTION

Input modules are usually classified as discrete input modules and analog input modules. Analog input modules are used to process signals from field devices such as pressure, level, temperature and weight sensors into numerical data. Discrete input modules are used to convert signals from field devices such as pushbuttons, limit and proximity switches, and photo sensors into signals that can be used by a signal processor commonly known in the automation industry as a programmable logic controller (PLC). Typically, an input module has an output linking to one end of a field device to provide power to the field device, and an input linking to the other end of the field device to receive signals therefrom, as shown in FIG. 1. In particular, a discrete input module applies a voltage to the field device while an analog input module provides a current to the field device.

Modicon presently produces and markets a variety of input modules. Among these Modicon input modules, discrete modules come with many different supplied voltage levels: 115 VAC, 230 VAC, 24 VDC, 24 VAC/VDC, 48 VAC/VDC, 125 VDC, 5V TTL, etc. When a field device such as an ON/OFF switch is used to connect to a 24 VDC discrete module, for example, the voltage at the input of the input module is either 24 VDC or 0 VDC in an ideal situation. From the received input voltage at the input module, it is possible to determine when the switch is switched ON or OFF. However, the input signals usually contain noise, transients, voltage drift and other unwanted components, and these unwanted components may distort the waveform of the input signals and render the switching timing measurement difficult.

In an AC input module, the received signals may also contain other unwanted components which are due to the zero-crossing of the AC voltage. It is necessary to filter out these transients, noise and zero-crossing induced spikes in the signals. Furthermore, the voltage at the input of an input module is in the form of AC signals when the switch is operated at the ON state. Preferably, the received signals be converted into a binary waveform so that the switching timing can be determined more easily.

Presently, the filtering process of an AC input line uses a sampling method to sample the binary waveform at a fixed sample rate to produce a filtered ON input state and a filtered OFF input state. The filtering algorithm is determined based on the characteristics of the input module. For a 120VAC module, the input line is full-wave rectified to produce a binary waveform having a HIGH period and a LOW period, depending on the root-means squared voltage (VRMS) of the input line, as shown in TABLE 1.

TABLE 1

| Input (VRMS) | HIGH time (msec) | LOW time (msec) |
|---|---|---|
| 40 and below | 0 | always OFF |
| 50 | 1 | 7.4 |
| 65 | 3.6 | 4.8 |
| 80 | 4.9 | 3.5 |
| 110 | 6 | 2.4 |

It should be noted that the sum of the HIGH time and the corresponding LOW time for an input voltage 50 VRMS or higher is equal to 8.4 msec. This sum is derived from the 60 Hz cycle of the AC voltage.

The basic idea of the filtering process is to produce a filtered ON state whenever a HIGH state lasts at least 6 msec and a filtered OFF state whenever a continuous 6 msec HIGH state is absent over a period of 8.4 msec. With a sampling rate of one sample every 0.3 msec, the number of samples within the minimum 6 msec of HIGH time period is 20. Similarly, the number of samples within the 8.4 msec absence of the HIGH state is 28. In order to keep track of the HIGH and LOW time periods, a counter is used to record the sampling result. Because the minimum continuous HIGH time (6 msec) to produce a filtered ON state and the continuous minimum OFF time (8.4 msec) to produce a filtered OFF state are not equal, one cannot simply use an UP/DOWN counter to keep track of the HIGH and LOW time periods. Mathematically, one must use a common multiple of 20 and 28 as a maximum count to set the filtered input state to ON. The Lowest Common Multiple of 20 and 28 is 140. If a counter is used to keep track of the sampling results, one would add 7 to the counter every time the sampling occurs at the HIGH state and subtract 5 from the counter every time the sampling occurs at the LOW state. By doing so, when the reading on the counter has reached 136, the filtered input state can be set to ON. When the reading on the counter has been reduced to 0, the filtered input state can be set to OFF.

In consideration of the limited space in the input module memory, however, it is desirable to have a smaller maximum count to set the filtered input state to ON. When hysteresis of the rectifier circuit is taken into account and a sampling time of 0.1 msec is used, the acceptable smallest number to be used as an approximate lowest common multiple of 20 and 28 is 60. As a counter is used to keep track of the sampling results, an increment of 3 (=60/20) on the counter reading is made every time the sampling occurs at the HIGH state and a decrement of 2 (~60/28) on the counter reading every time the sampling occurs at the LOW state. Accordingly, when the reading on the counter has reached 57, the filtered input state can be set to ON. Likewise, when the reading on the counter has been reduced to 0, the filtered input state can be set to OFF.

Thus, the software algorithm is as follows:
 if input is HIGH and if the number of counts is equal to or greater than 57, set filtered state to
 On else add 3 to the counter
 else if the number of counts is equal to or less than 0, set filtered state to OFF else subtract 2 from the counter.
This algorithm is illustrated in FIG. 4.

The filtering algorithm is determined by the rate at which the input line can be sampled and the amount of time a pulse of the rectified waveform remains HIGH or LOW in a cycle. Therefore, the maximum count, increment count and decrement count in the software algorithm to be used with one input module are different from those for another input module, as shown in TABLE 2.

TABLE 2

| Module Types | Max Count | Incre. Count | Decre. Count |
| --- | --- | --- | --- |
| 120 VAC 16 PT & 32 PT | 57 | 3 | 2 |
| 240 VAC isolated 16 PT | 60 | 4 | 2 |
| 24 VAC 16 PT & 32 PT | 60 | 4 | 2 |
| 48 VAC 16 PT & 32 PT | 54 | 3 | 2 |

The filtering algorithm for 240VAC isolated 16PT input module and 24VAC 16/32PT input module is as follows:

if input is HIGH and if the number of counts is equal to or greater than 60, set filtered state to ON else add 4 to the counter else if the number of counts is equal to or less than 0, set filtered state to OFF else subtract 2 from the counter.

The above algorithm is illustrated in FIG. 5. Presently, hardware jumpers are used to select the filter parameters Max Count, Increment Count and Decrement Count for a different type of input module.

In an automation island where a large number of different input modules are used to carry out different tasks, each different input module has its own unique filtering algorithm to suit the electrical characteristics of the input module. Furthermore, each different input module has its own input sample rate, different port pins and filter rate.

It is advantageous and desirable to provide a single filter algorithm that can be used by a variety of different input modules.

SUMMARY OF THE INVENTION

It is an object of the present invention to provide a method for filtering an input signal received by an input module from a field device, wherein one filtering algorithm can be used by a variety of different input modules.

It is another object of the present invention to provide an input module which is adapted to receive and filter input signals using a common filtering algorithm that can also be used by other different input modules.

The method, according to the present invention, is used to filter an input signal in order to produce a filtered input signal, wherein the received input signal is converted such that it has either a HIGH input state or a LOW input state each having a time duration characteristic of the input module, and the filtered input signal is represented by an ON filtered state and an OFF filtered state, and wherein the method determines the time duration of the HIGH input state and the LOW input state by way of sampling at a sampling rate, and uses a counter to keep track of the sampling results in order to set the filtered input state to ON or OFF. The method includes using a filtering algorithm to carry out the following logical steps for each sample:

1) increasing the counter reading by an increment count if the input signal is HIGH at the time of sampling and the counter reading is smaller than a maximum count;

2) setting the filtered input state to ON if the input signal is HIGH at the time of sampling and the counter has reached the maximum count;

3) decreasing the counter reading by a decrement count if the input signal is LOW at the time of sampling and the counter reading is greater than a minimum count; and 4) setting the filtered input state to OFF if the input signal is LOW at the time of sampling and the counter has been reduced to the minimum count, wherein the filter parameters of maximum count, increment count and decrement count can be electronically selected so that the same filtering algorithm can be used for a plurality of different input modules having different electrical characteristics.

Accordingly, the input module of the present invention includes a device for storing the filtered input state; a device for storing filter parameters; a device for storing a filter algorithm; a counter having a reading to keep track of sampling results; and a logic unit to determine whether the input signal is HIGH or LOW at the time of sampling, so as to allow the filter algorithm to carry out the logical steps. The input module is configurable so that the filter parameters can be electronically selected to suit the characteristics of the input module.

The present invention will become apparent upon reading the descriptions taken in conjunction with FIGS. 1 to 5.

DETAILED DESCRIPTION OF THE INVENTION

Figure 1:
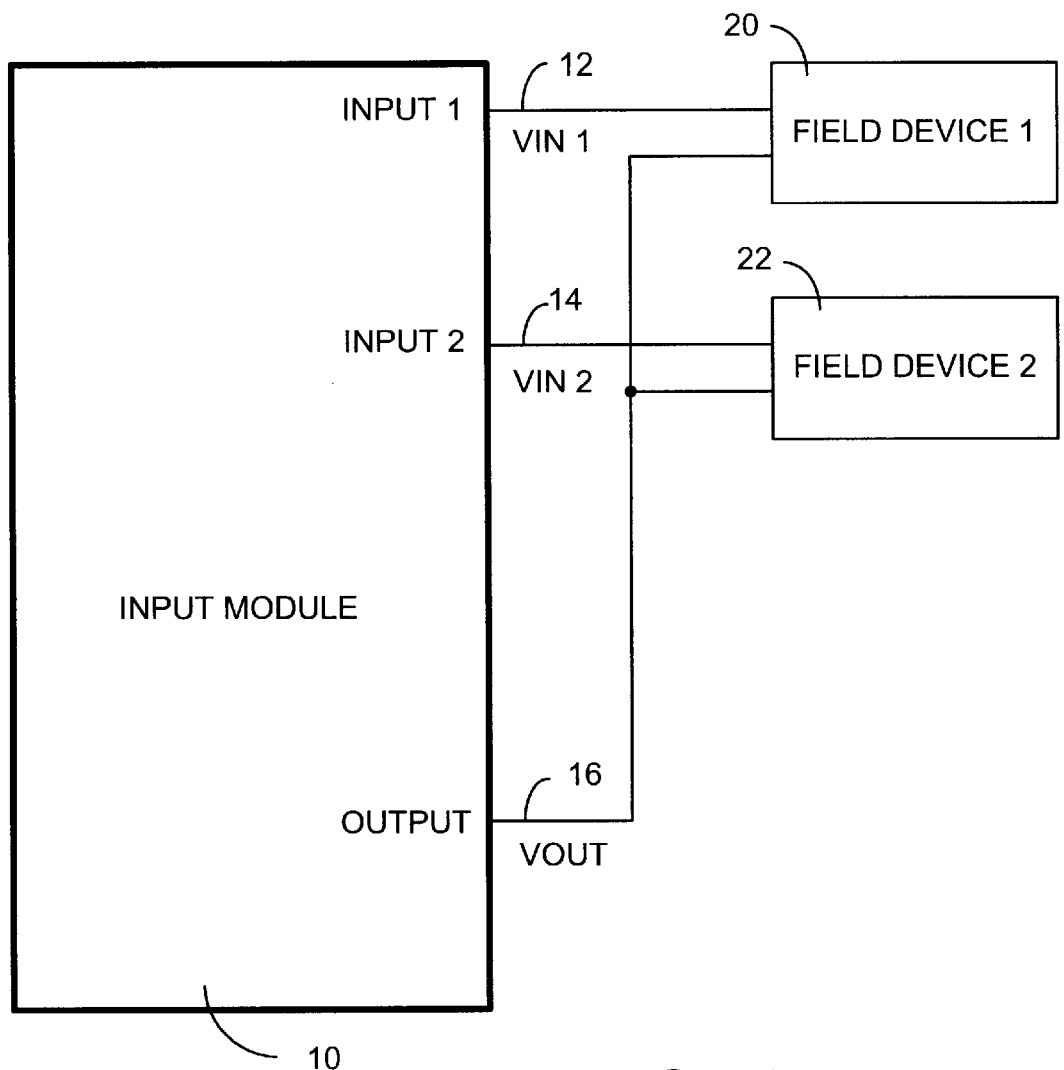
FIG. 1 is a block diagram showing an input module connected to two field devices.

As shown in FIG. 1, an input module 10 is connected to two field devices 20, 22 at inputs 12, 14, respectively, in order to receive signals from the field devices 20, 22. The input module 10 has an output 16 to provide electrical power to the field devices 20, 22. As shown, the electrical connection between the output 16 to the field device 20 and the connection between the field device 20 to the input 12 form a current loop. Similarly, the connections to the field device 22 also form a current loop. If the voltage at the output 16 is an AC voltage and the field device 20 or 22 is an ON/OFF switch, for example, then the voltage at the input 12 or 14 is expected to be an AC voltage when the switch is operated at the ON position. Thus, by monitoring the presence of the AC voltage at the input 12 or 14, one would be able to find out when the switch is turned on or off. Because of the transients, noise and other unwanted components that may be mixed with the signals received at the inputs 12, 14, the received signals must be filtered so that the ON and OFF timing of the switch can be correctly monitored.

Figure 2:
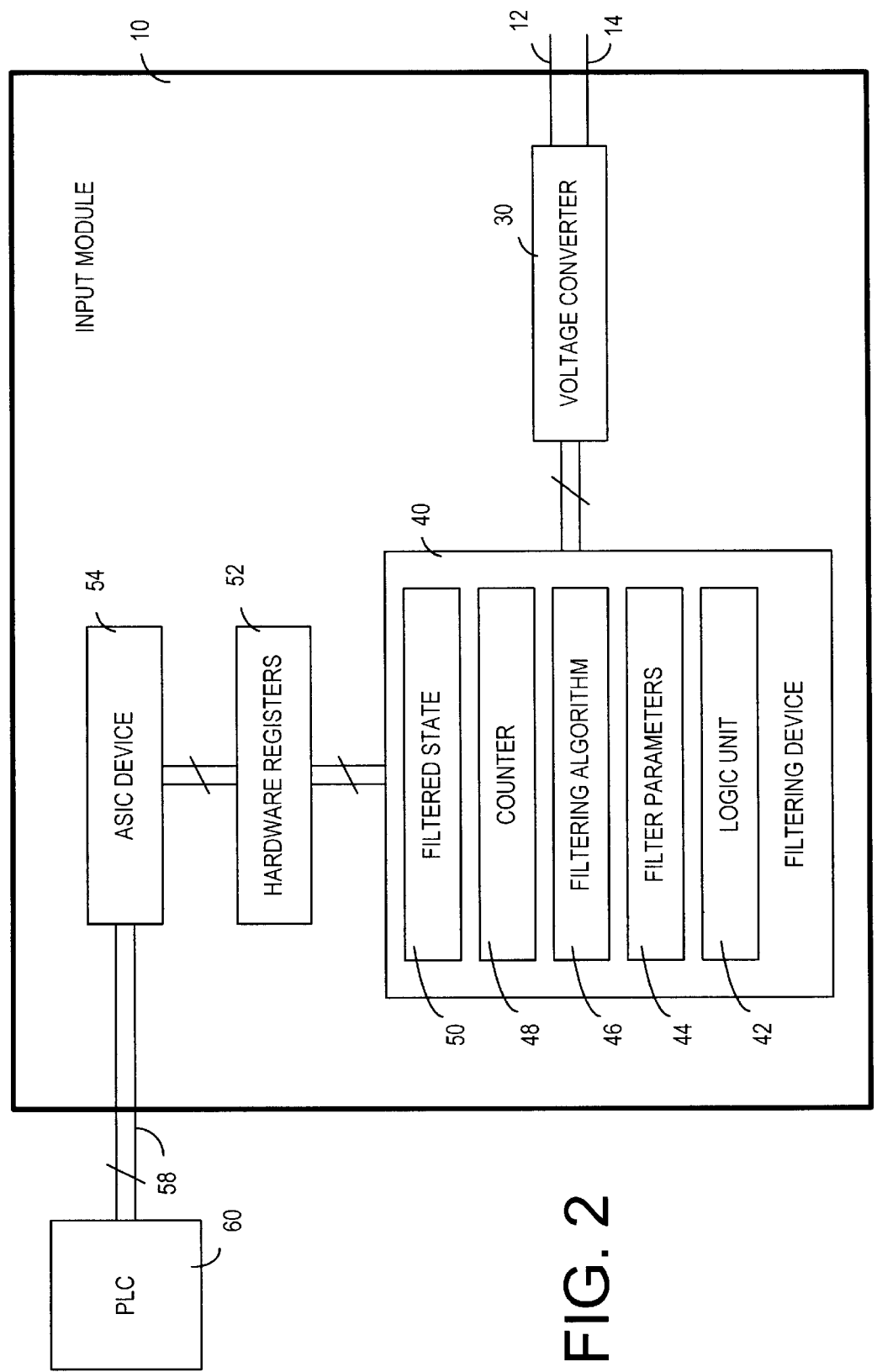
FIG. 2 is a block diagram showing the components within an input module.

The input module 10 includes a waveform converting device 30 to convert the voltage at the inputs 12, 14 into a waveform from which the input ON and OFF states can be determined. As shown in FIG. 2, the input module 10 further includes a filtering device 40 using a filtering software program to filter out the unwanted components from the input signals. Preferably, the waveform to be filtered by the filtering device 40 is a train of binary pulses having either at HIGH or a LOW level as shown in TABLE 1. The filtering device 40 includes a logic unit 42 to determine whether the binary pulse train is a the HIGH level or LOW level; a memory unit or register 44 to store filter parameters such as the sampling rate, the maximum count, the increment count, the decrement count and the minimum count; a memory unit 46 to store a filtering algorithm; a counter 48 to keep track of the sampling results; and a memory unit or register 50 to store the status of the filtered input state as a function of time. After being filtered, the input signals become a binary waveform having a filtered ON input state and a filtered OFF input state as indicated in the register 50. The filtered waveform for each input 12 or 14 is placed into a hardware register 52 or similar device so as to allow the filtered waveform to be conveyed to a data collection device such as a Programmable Logic Controller (PLC) 60 through an Application Specific Integrated Circuit (ASIC) device 54.

The number of inputs of an input module can range from 1 to 32 or higher. In order to filter the input signals from each input independently and efficiently, a Quantum BUS 58 is used to convey signals within the input module 10 from the waveform converting device 30, through the filtering device 40 and the hardware register 52 to the ASIC device 54; and from the ASIC device 54 to the PLC 60. If the input module 10 is an AC module, then the waveform converting device 30 is adapted to perform a full-wave rectification of the input signals.

Figure 3:
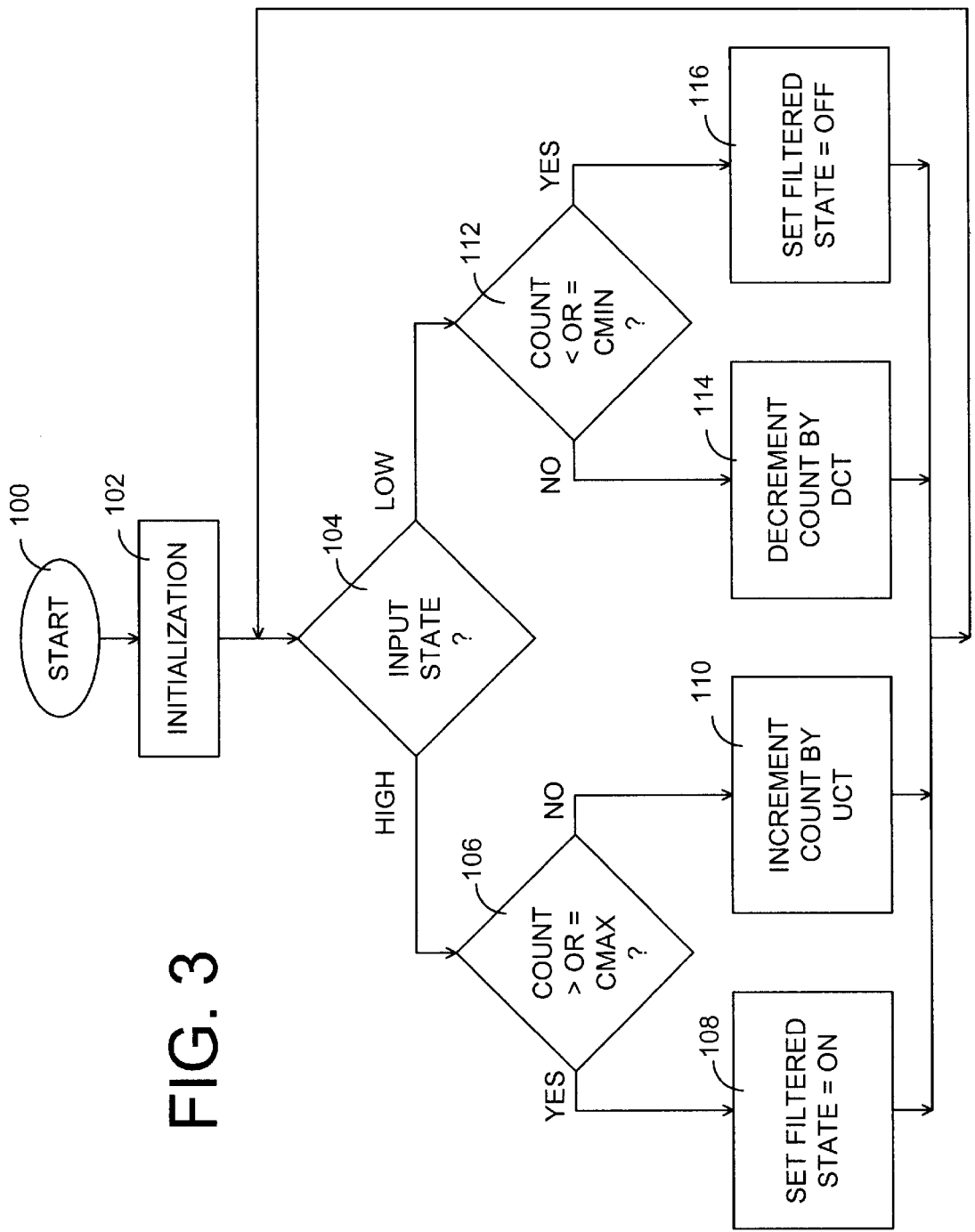
FIG. 3 is a flow chart illustrating the filter algorithm, according to the present invention.
Figure 4:
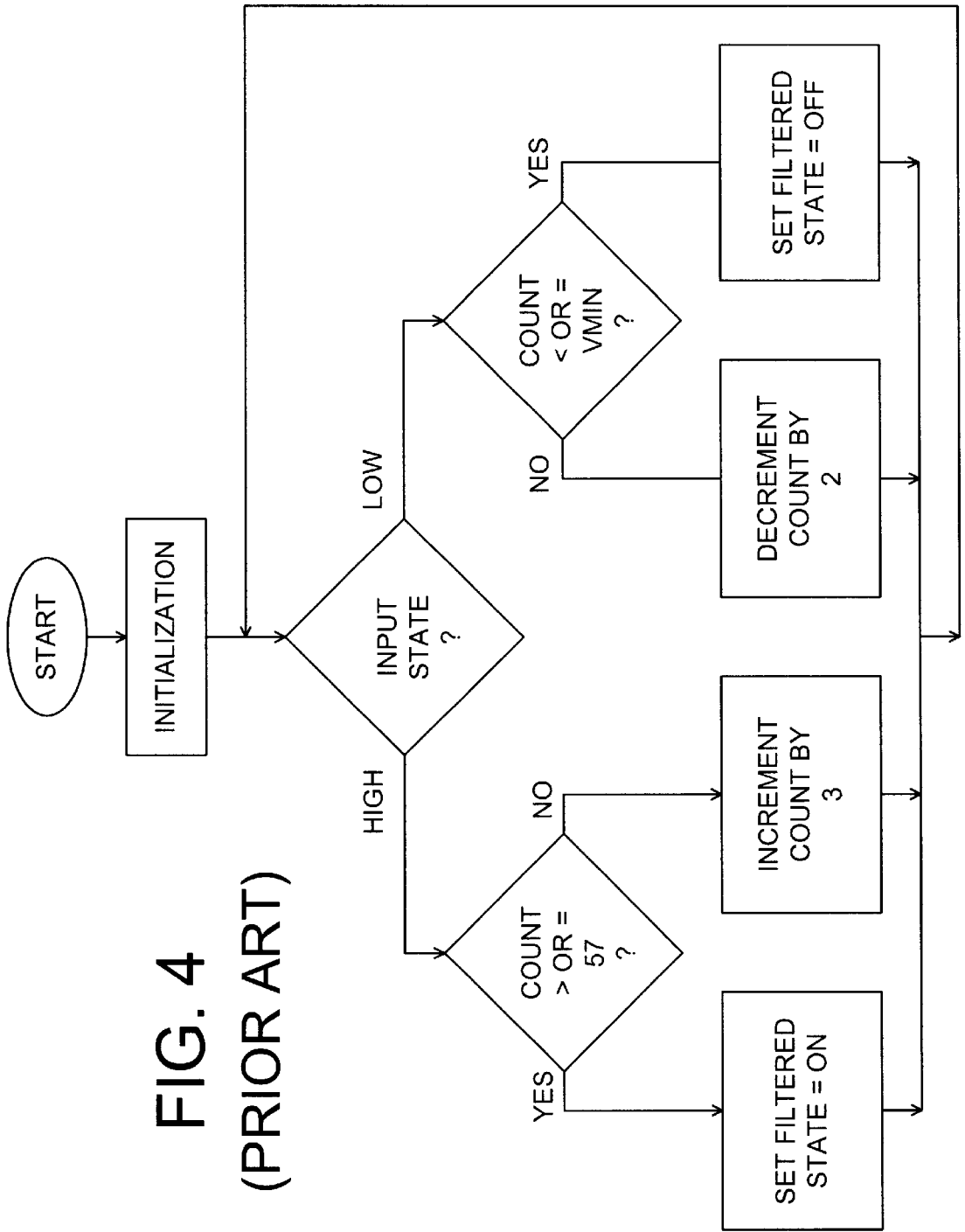
FIG. 4 is a flow chart illustrating a prior art filter algorithm to be used with a 120VAC input module as listed on TABLE 2.
Figure 5:
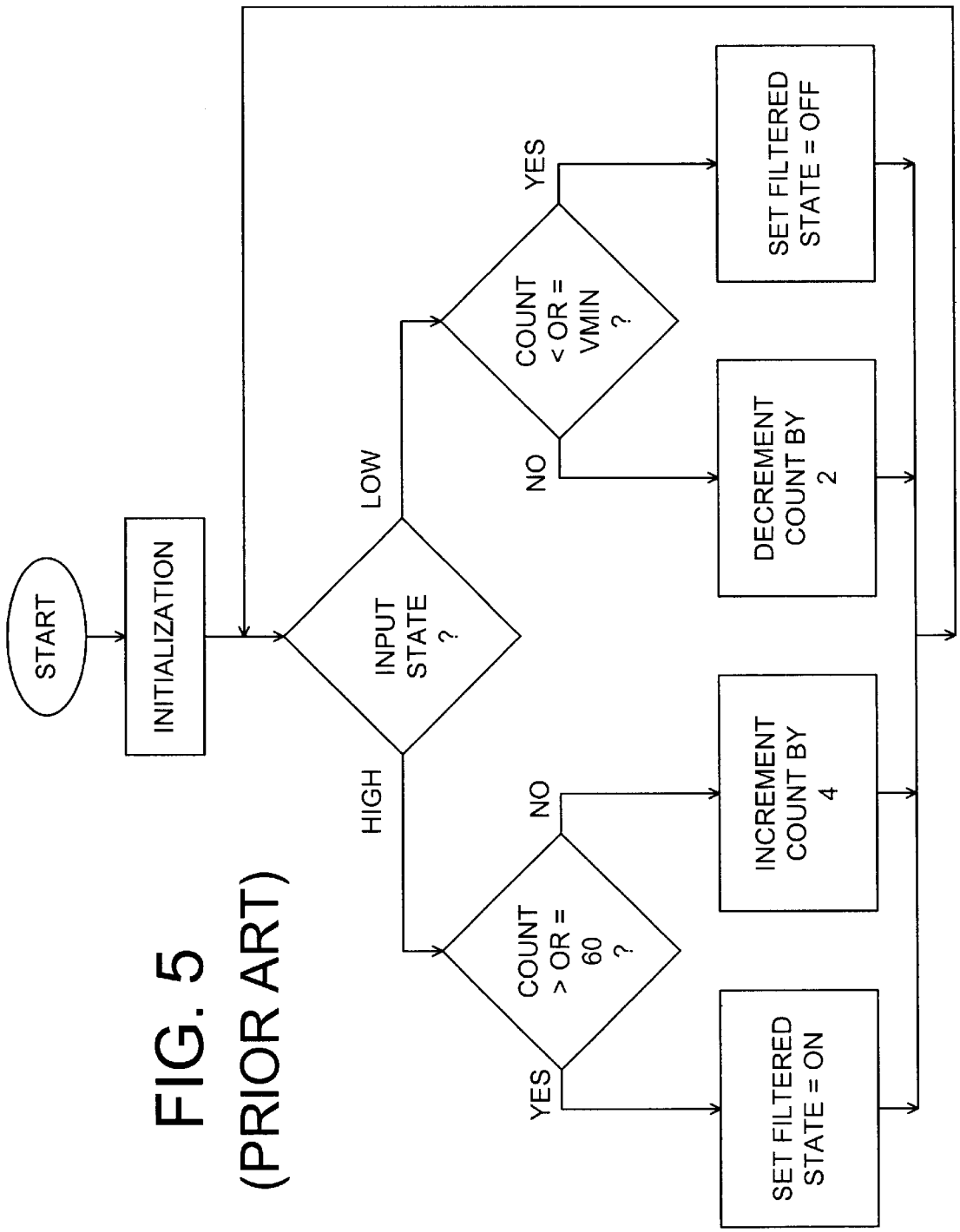
FIG. 5 is a flow chart illustrating another prior art filter algorithm to be used with a 240VAC input module or a 24VAC input module as listed on TABLE 2.

The filtering algorithm that is stored in the memory unit 46, according to the present invention, is illustrated in FIG. 3. As shown, when the input module 10 is powered up at step 100, a power-up initialization procedure is carried out to run a confidence test and reset the hardware register 52, the counter 48, and so forth at step 102. The filter parameters such as the sampling rate, the maximum count (CMAX), the minimum count (CMIN), the increment count (UCT) and the decrement count (DCT) can be set up at step 102 so that the filtering process can be started. These filter parameters can be assigned to the input module 10 by the PLC 60 through the Quantum BUS 58. The filter parameters can also be electronically selected by other means at step 102 or at an earlier time.

After the initialization procedure, the forever loop having the logical steps 104–116, as shown in FIG. 3, starts at step 104 to begin the sampling process. Each loop represents a new sample. Whenever the converted waveform from the waveform converting device 30 is sampled, the logic unit 42 is used to determine whether the input state as indicated on the converted waveform is HIGH or LOW. If the input state is HIGH, then the filtering algorithm 46 will continue at step 106. At step 106, if the value shown on the counter 48 has reached the maximum count or CMAX, then the filtered input state is set to ON at step 108, otherwise the counter value is increased by the increment count or UCT at step 110. If the input state is LOW, then the filtering algorithm will continue at step 112. At step 112, if the value shown on the counter 48 has been reduced to the minimum amount or CMIN, then the filtered input state is set to OFF at step 116, otherwise the counter value is decreased by the increment count or DCT at step 114. The filtering process is looped back to step 104 for another sample.

The filter parameters that are used in the filtering algorithm by the filtering device 40 may vary with different types of input modules, as shown in TABLE 2. The input module 10, according to the present invention, can be configured so that the filter parameters stored in the memory unit or register 44 can be electronically selected to suit the characteristics of the input module 10. For example, if the input module to be used with a field device is 48VAC input module with 16PT/32 PT, then the input module can be configured so that the maximum count (CMAX), the increment count (UCT), and the decrement count (DCT) can be electrically set to 54, 3 and 2, respectively, and these newly set values are stored in the memory unit 44, to be used by the filtering algorithm. It is preferred that the minimum count. (CMIN) is set equal to 0. With the input modules being configurable, only one filtering algorithm is needed for all input modules.

As for DC modules, the input voltage is a DC voltage and, therefore, a full-wave rectifier is not needed to convert the input voltage to a binary waveform. However, the waveform converting device 30 may still be useful to scale up or down the input voltage to suit the sampling requirements of the filtering device 40. For example, a maximum count of 2, an increment count of 1, and a decrement count of 1, can be used by the same filtering algorithm to filter out spikes and noise in the DC input voltage.

Thus, the present invention has been described with respect to a preferred embodiment thereof, and it will be understood by those skilled in the art that the foregoing and various other changes, omissions and deviations in the form and detail thereof may be made without departing from the spirit and scope of this invention.

What is claimed is:

1. A method of filtering an input signal received by an input module in order to produce a filtered input signal, wherein the received input signal has a first voltage level and a second voltage level each has a time duration characteristic of the input module, and the filtered input signal is represented by a filter input state having a first filtered state and a second filtered state, and wherein said method determines the time duration of the first voltage level and the second voltage level by way of sampling at a sampling rate, and uses a counter having a reading to keep track of sampling results in order to set the filtered input state to the first filtered state or the second filtered state, for each sampling said method comprising the steps of:

1) increasing the counter reading by an increment count if the input signal is at the first voltage level at the time of sampling and the counter reading is smaller than a maximum count;
   2) setting the filtered input state to the first filtered state if the input signal is at the first voltage level at the time of sampling and the counter has reached the maximum count;
   3) decreasing the counter reading by a decrement count if the input signal is at the second voltage level at the time of sampling and the counter reading is greater than a minimum count; and
   4) setting the filtered input state to the second filtered state if the input signal is at the second voltage level at the time of sampling and the counter has been reduced to the minimum count, wherein
      the input module is configurable so as to allow the at least one of maximum count, the increment count and the decrement count to be changed to suit the characteristics of the input module.

2. The method of claim 1, wherein the minimum count is set to be zero.

3. The method of claim 1, wherein the first voltage level is represented by a HIGH voltage state and the second voltage level is represented by a LOW voltage state.

4. The method of claim 1, wherein the first filtered state represents an ON state and the second filtered state represents an OFF state.

5. The method of claim 1, wherein the input signal is converted from an AC waveform of a substantially fixed cycle having a time-averaged voltage value, and wherein the sum of the time duration of the first voltage level and the time duration of the second voltage level is inversely proportional to the cycle.

6. The method of claim 5, wherein the input signal is converted from the AC waveform by means of full-wave rectification.

7. The method of claim 1, wherein the input module receives the input signal from a field device.

8. The method of claim 1, wherein the sampling rate is variable according to the input signal and the characteristics of the input module.

9. A software program embodied in an input device for filtering an input signal received by the input device in order to produce a filtered input signal, wherein the received input signal is either at a first voltage level or a second voltage level each having a time duration characteristic of the input device, and the filtered input signal is represented by a filtered input state having a first filtered state and a second filtered state, and wherein said input device for filtering uses a sampling method to determine the time duration of the first voltage level and the second voltage level, and uses a counter having a reading to keep track of sampling results in order to set the filtered input state to the first filtered state or the second filtered state, said software program comprising:

a first code, responsive to counter reading and to the input signal at the first voltage level, for setting the filtered input state to the first filtered state if the counter reading is equal to or greater than a maximum count, and increasing the counter by an increment amount if the counter reading is smaller than the maximum count; and a second code, responsive to the counter reading and the input signal at a second voltage level different from the first voltage level, for setting the filtered input state to the second filtered state if the counter reading is equal to or less than a minimum count, and decreasing the counter by a decrement amount if the counter reading is greater than the minimum count;

wherein the input device is configurable so as to change the maximum count, the increment amount and the decrement amount to suit the characteristics of the input device.

10. An electronic module for filtering an input signal in order to produce a filtered input signal, wherein the received input signal has a first voltage level and a second voltage level each having a time duration characteristic of the module, and the filtered input signal is represented by a filtered input state having a first filtered state and a second filtered state, and wherein said electronic module for filtering uses a sample method having a sample rate to determine the time duration of the first voltage level and the second voltage level, said electronic module comprising a filtering device which includes:

first means for storing the filtered input state;

second means for storing filter parameters;

third means for storing a filter algorithm;

a counter having a reading to keep track of sampling results; and a logic unit to determine whether the input signal is at the first voltage level or the second voltage level at the time of sampling, so as to allow the filter algorithm to carry out the following logical steps:

1) increasing the counter reading by an increment count if the input signal is at the first voltage level at the time of sampling and the counter reading is smaller than a maximum count;

2) setting the filtered input state to the first filtered state if the input signal is at the first voltage level at the time of sampling and the counter has reached the maximum count;

3) decreasing the counter reading by an decrement count if the input signal is at the second voltage level at the time of sampling and the counter reading is greater than a minimum count; and 4) setting the filtered input state to the second filtered state if the input signal is at the second voltage level at the time of sampling and the counter has been reduced to the minimum count, wherein the filter parameters stored in the second storing means include the maximum count, the increment count and the decrement count and wherein the module is configurable to change the filter parameters to suit the characteristics of the module so as to eliminate the need to change the filter algorithm.

* * * * *